(12) United States Patent
Hogeboom

(10) Patent No.: US 6,194,949 B1
(45) Date of Patent: Feb. 27, 2001

(54) DRIVER CIRCUIT FOR HIGH SPEED DATA

(75) Inventor: John Gordon Hogeboom, Nepean (CA)

(73) Assignee: Nortel Networks Limited, Montreal (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/034,905

(22) Filed: Mar. 4, 1998

(51) Int. Cl.[7] ............................. H03K 17/16; H03K 17/04
(52) U.S. Cl. ........................ 327/391; 327/108; 327/374; 326/27; 326/58; 326/86
(58) Field of Search ................................ 326/17, 26, 27, 326/56, 57, 58, 83, 86; 327/333, 389, 391, 108, 374, 543, 541, 214, 52; 330/9, 51, 253, 258

(56) References Cited

U.S. PATENT DOCUMENTS

| | | | |
|---|---|---|---|
| 4,752,703 | * | 6/1988 | Lin ........................................ 327/391 |
| 5,389,840 | * | 2/1995 | Dow ...................................... 327/357 |
| 5,450,026 | * | 9/1995 | Morano ................................. 326/84 |
| 5,703,532 | * | 12/1997 | Shin et al. ............................ 330/253 |
| 5,767,699 | * | 6/1998 | Bosnyak et al. ..................... 326/86 |
| 5,859,566 | * | 1/1999 | Voorman et al. .................... 330/252 |
| 5,880,599 | * | 3/1999 | Bruno .................................... 326/56 |

* cited by examiner

Primary Examiner—Timothy P. Callahan
Assistant Examiner—Terry L. Englund

(57) ABSTRACT

A CMOS driver circuit for high-speed data transmission has a complementary differential switch formed by four transistors, a bias cell containing current mirrors controlled by a reference current, two drive-current limiting devices for limiting the drive current to a required value via the bias cell, a current-shunting switch, and buffers which drive each of the gate nodes of the switches. CMOS transistors used in these buffers are limited in size to limit the rate at which they operate the switches and to limit the rate at which current is steered from one side of the differential switch to the other. One supply side of each of these buffers is connected to one of the current-limited supply nodes of the main output switches, thus greatly reducing variations in switching rate. The CMOS devices have sizes optimized to achieve both the required switching speed and minimized sensitivity to variations affecting switching speed.

12 Claims, 2 Drawing Sheets

DRIVER CIRCUIT FOR HIGH SPEED DATA

FIELD OF THE INVENTION

This invention relates generally to digital data transmission and, more particularly, to a high-speed driver circuit for digital data transmission.

BACKGROUND OF THE INVENTION

Data transmission of high-speed data at rates having bit periods on the order of one nanosecond over distances on the order of one meter requires relatively high performance interfaces, yet also requires or benefits from limited and controlled rise and fall times to minimize distortion, signal reflections, and electromagnetic interference (EMI). The root causes of distortion and reflection include skin effects in conductors, the high-frequency loss behavior of circuit board dielectric materials, and various physical discontinuities at bends, vias, and connectors. Several high speed interface standards have seen little use and success because the short rise and fall times used to limit delays and signal degradation under slow conditions (such as worst-case devices, low voltage, and high temperature) also produce excessive slew rate which leads to signal reflections and EMI, under conditions which give faster device operation. Providing the needed tight control of rise time usually introduces drive circuitry complications and requires ultimate speed capability much greater than the controlled rate. Such added complexity usually significantly increases signal propagation time through such driver circuitry. When factors such as supply voltage, temperature, and device manufacturing tolerances are taken into account, it is common for circuits to have a two-to-one practical range or even wider ranges in speed performance. Such wide ranges require either system designs predicted on the lowest-performance circuits or selection of the higher-performance circuits, with consequent waste of the lower-performance circuits.

PROBLEMS SOLVED BY THE INVENTION

The present invention achieves the required regulation of output rise and fall times in a data line driver with no increase in signal propagation delay other than that of the rise and fall times themselves and with no increase in complexity or power dissipation over drivers of the prior art.

PURPOSE, OBJECTS, AND ADVANTAGES OF THE INVENTION

The purpose of the invention is providing an improved high-speed driver circuit for digital data transmission, having much reduced variation in rise and fall times. Thus one object of the invention is reduction of variation in data rise and fall times in comparison with driver circuits available heretofore. Another object is avoiding significant increases in complexity and signal propagation time. A related object is a driver circuit using a minimum number of devices. Another object is providing such driver circuits at low cost and with low power consumption. A related object is providing such driver circuits made using complementary metal-oxide-semiconductor (CMOS) process technology. Other objects include minimizing susceptibility of the driver circuit to noise and to external radiation interference. Thus, a related object is a driver configuration that is fully differential. A further related object is higher characteristic line impedance as provided by differential wiring, thus allowing reduced drive current in comparison with drive currents employed in the background art. A still further related object is substantial mutual cancellation of two matched opposing signals of a differential pair, with respect to coupling to and from other signals, and with respect to coupling to and from the power supply rails. Finally, a major object is a particular new interconnection structure of input buffers and output switches in a current-limited complementary differential CMOS driver, as described herein. These and other purposes, objects, and advantages will become apparent from a reading of the following description, along with the accompanying drawings.

SUMMARY OF THE INVENTION

The driver circuit for high speed data has a complementary differential switch formed by four transistors, a bias cell containing current mirrors controlled by a reference current, two drive-current limiting devices for limiting the drive current to a required value via the bias cell, current-shunting switches, and a suitable number of buffers (logical product buffer gates), which drive each of the gate nodes of the switches. Transistors used in these buffers are limited in size to control the rate at which they operate the switches and to control the rate at which current is steered from one side of the differential switch to the other. One supply side of each of these buffers is connected to one of the current-limited supply nodes of the main output switches, thus greatly reducing variations in switching rate.

DETAILED DESCRIPTION OF THE PREFERRED EMBODIMENTS

Figure 1:
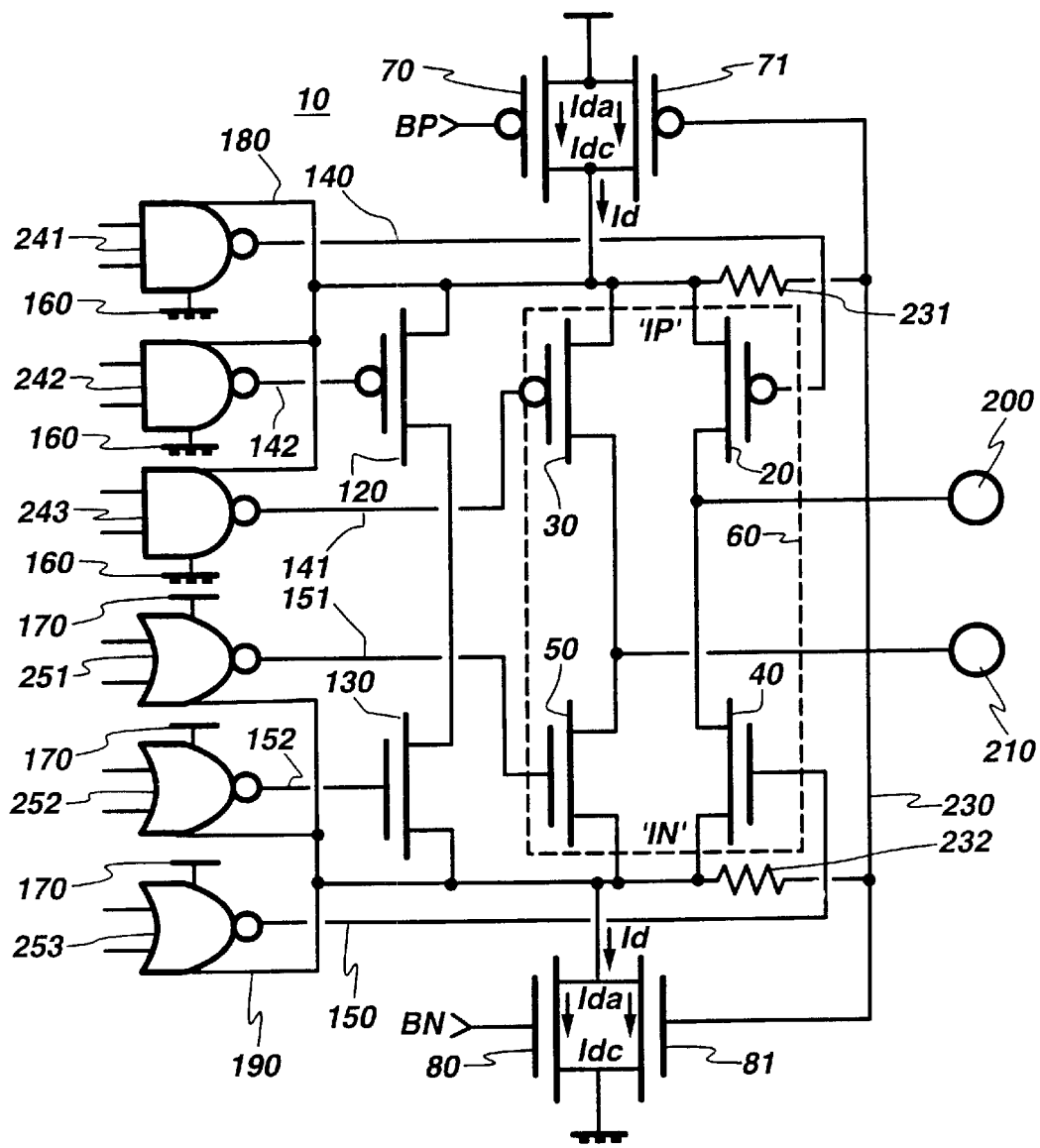
FIG. 1 shows a schematic diagram of a driver circuit for high speed data, made in accordance with the invention.

A schematic diagram of the driver circuit, generally denoted by reference numeral 10, is shown in FIG. 1. The preferred driver configuration to be described is fully differential as this allows reduced power and minimizes radiation and noise sensitivity. The characteristic line impedance is larger for differential wiring, allowing reduced drive current, and allowing the two matched opposing signals of the differential pair to largely cancel one another in terms of coupling to and from other signals and in terms of coupling to and from the supply rails. The basic driver circuit 10 is as simple as possible, consisting of 4 CMOS transistors (20, 30, 40, and 50) forming a complementary differential switch 60, 2 PMOS transistors (70 and 71), and 2 NMOS transistors (80 and 81) for limiting the drive current to the required value via a bias cell 90 (shown in FIG. 2) containing current mirrors (100 and 110) controlled by a reference current. To this is added another pair of MOS switches (PMOS switch 120 and NMOS switch 130) which can shunt the current from both current sources when all the main switches are turned off. These added switches are provided for applications where the driver needs to share a bus with other drivers and therefore needs to switch on and off as quickly and cleanly as possible. Other elements involved are the gate nodes of the switches (P-type switch gate nodes 140, 141, and 142, and N-type switch gate nodes 150, 151, and 152) driven by buffers. By limiting transistor sizes used in these buffers, the rate at which the buffers operate the switches, and hence, the rate at which current is steered from one side of the differential switch to the other, are also limited. By connecting one supply side (160 and 170) of each of these buffers to one of the current-limited supply nodes (180 and 190) of the main output switches, the variations in switching rate are greatly reduced as discussed below. The complementary output terminals are designated by reference numerals 200 and 210.

Since the structure is differential, the four buffers driving the main switching transistors form two matched pairs. However, the size ratio of the n-channel to p-channel devices in each of these can also be varied to attain the desired speed performance and balance once the switch sizes are chosen. The switch sizes are key to the overall optimization as it is their impedance variation, and thus the variation in the voltage at the current-limited nodes 'IP' 180 and 'IN' 190, that is responsible for the compensation effects. Basically, as conditions or device performance change such as to weaken device drive and reduce speed, for example, the voltage drop across the switches increases, and thus the supply voltage to the buffers also increases, increasing their output slew rate and voltage swing, thereby compensating for the change to a specific degree. It is important to notice that the voltage at current-limited nodes 180 and 190 will be varied by the voltage drop across the switches plus the output signal amplitude at outputs 200 and 210. The effect of the output signal amplitude on the voltages at nodes 180 and 190 is also beneficial, since an increased output signal requires increased buffer output swing and slew rate to give the same relative switching performance. The quantitative details are complicated by the non-linear square law behavior of MOS devices and a variety of second order effects. However, the essence of the compensation remains the same, and the optimization procedure does not require full appreciation of the details. Obtaining a very significant reduction in variation turns out not to be a highly sensitive function of device sizes. Thus a significant reduction in variation is easily obtained and is easily made effective over quite a wide range of drive circuit characteristics. The invention does not involve the incorporation of any additional devices to control rise and fall times but instead involves a particular new interconnection of input buffers and output switches of a current-limited complementary differential CMOS driver. This interconnection scheme is combined with device size optimizations to achieve both the required switching speed and minimized sensitivity to variations which would normally affect speed performance. Typically it is sufficient for the switches to have suitable sizes to yield the same total nominal impedance as their respective loads, and then to adjust the switch buffers to give the desired switching speed. Thus, experience has shown that highly effective compensation is obtained over quite a significant range of device sizes and drive current settings by performing a straightforward optimization.

Conventional <<predriver>> control gates (NAND gates 241, 242, and 243 and NOR gates 251, 252, and 253) are used to combine input data signals with enable/disable control signals. As is known in the art, NAND gates are conveniently used for driving PMOS devices, while NOR gates are conveniently used for driving NMOS devices. In FIG. 1, however, the supply voltage terminals of these control gates are connected to the appropriate current-limited supply nodes (180 or 190). Thus their switching speeds are affected so as to maintain the slew rates of the devices nearly constant.

Figure 2:
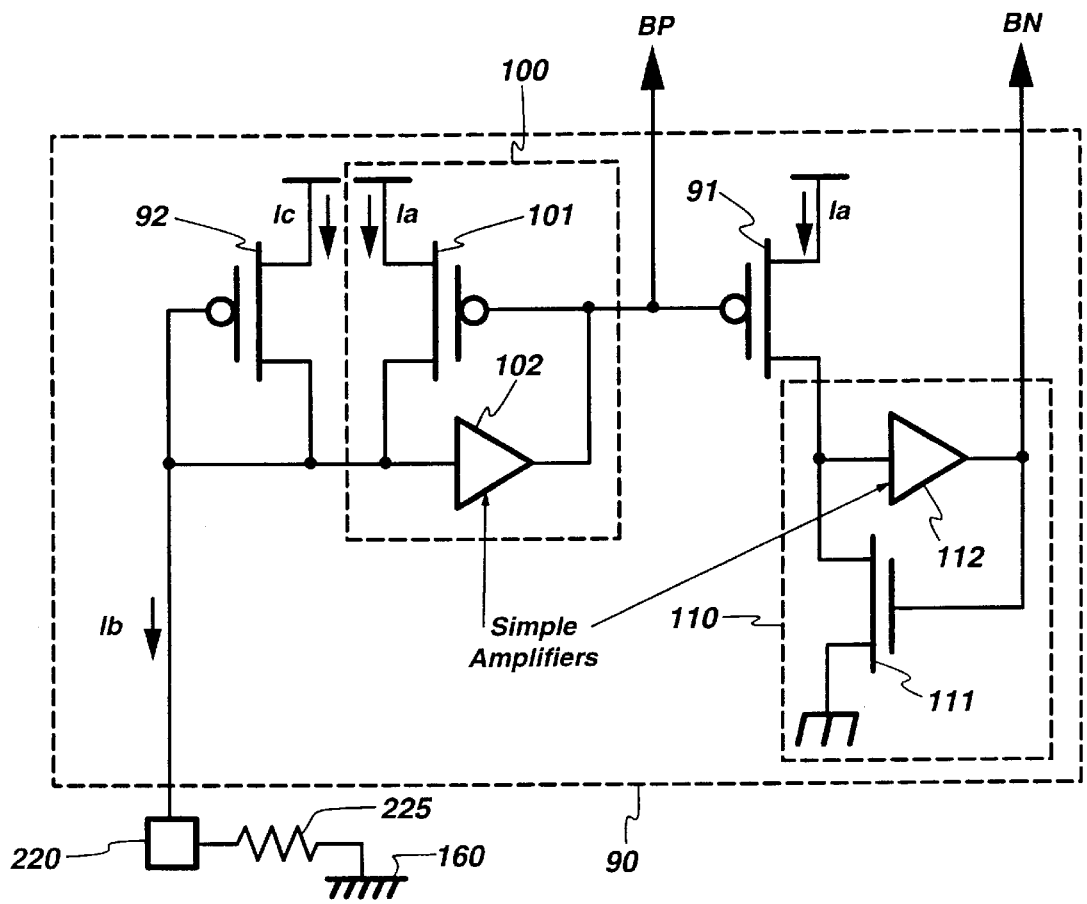
FIG. 2 shows a schematic diagram of a bias circuit used by a driver circuit made in accordance with the invention.

FIG. 2 shows a schematic diagram of a bias cell circuit preferably used by the driver circuit of FIG. 1. As mentioned above, the output current provided by the driver circuit is controlled in the positive direction by PMOS current-limiting devices 70 and 71 and in the negative direction by NMOS current-limiting devices 80 and 81. Devices 70 and 80 receive gate bias voltages from the bias cell such that the driver output current is proportional to a reference bias current applied to this bias cell. The same bias cell may be used by a number of driver circuits. Devices 71 and 81 adjust the balance between the driver's positive and negative currents so as to keep the average or <<common-mode signal>> voltage near the midpoint between the positive and negative supply voltages. This insures that the switches and current sources in the driver will operate in a near-optimum complementary manner.

Because the transistors of the differential switch all have substantially the same <<on>> impedance, current-limited node 180 operates above the <<common-mode signal>> voltage by nearly the same amount that current-limited node 190 operates below that <<common-mode signal>> voltage. Hence equal-valued resistors 231 and 232 form a voltage divider which produces very nearly the <<common-mode signal>> voltage at node 230. Thus node 230 is a common-mode feedback node. Use of this common-mode voltage for feedback to the current balance devices 71 and 81 is effective in providing near optimum balance when the driver is in its high-impedance mode as well as when it is providing current to the output terminals.

Device 92 in the bias cell provides a current proportional to that contributed to the driver by its current balance devices 71 and 81, thereby compensating for these devices by reducing by an equal amount the current provided by devices 70 and 80. Hence driver output current $I_d$ is proportional to input reference bias current $I_b$ because each is made up of equivalent proportional currents. That is, $$I_d = I_{da} + I_{dc} = k \cdot I_b = k \cdot I_a + k \cdot I_c$$

where k is a constant and the currents $I_d$, $I_{da}$, $I_{dc}$, $I_b$, $I_a$, and $I_c$ are as indicated in FIGS. 1 and 2. The value of the current-ratio constant k is equal to the ratio of the total width of each current-limiting MOS device in the driver vs. its equivalent device in the bias cell. The lengths of all such devices of equivalent pairs are made equal.

In the bias cell 90, the first current mirror 100 accepts the reference current $I_b$, which is normally provided by a resistor 205 from node 220 to the negative supply, and mirrors it by connection to the drain of a suitability-sized PMOS device 92 and to the input of a simple CMOS amplifier 102. The output of this amplifier is connected to the gate of the PMOS device 70 whose source is connected to the positive supply rail. Feedback through the amplifier (which includes a low-pass filter for stability) and the PMOS device maintains the input voltage close to the amplifier's center voltage, which is near the midpoint between the supply voltages. In doing this, it generates a gate voltage 'BP' such as to balance the reference current minus the compensation current provided by device 92. Device 91 in the bias cell feeds a matching current into the second current mirror 110 to provide bias voltage 'BN' in an equivalent but complementary manner. While current mirror 100 is formed of PMOS transistor 101 and CMOS amplifier 102, current mirror 110 is formed by NMOS transistor 111 and CMOS amplifier 112.

Thus, in one aspect, the invention provides a driver circuit useful for transmission of data signals on a channel, having a differential switch responsive to the data signals, a pair of complementary output terminals for connection to the channel, a bias cell, drive-current limiting devices for limiting respective drive currents to a required value via the bias cell, a current-shunting switch for switching currents to bypass the respective output terminals, and buffers which drive each of the gate nodes of the switches. In another aspect, the invention provides a driver circuit controlled by a reference current and utilizing a bias cell having two current mirrors controlled by the reference current. CMOS transistors used in the buffers are limited in size to limit the rate at which they operate the switches and to limit the rate at which current is steered from one side of the differential switch to the other. One supply side of each of the buffers is connected to one of the current-limited supply nodes of the main output switches, thus greatly reducing variations in switching rate. The CMOS devices have sizes optimized to achieve both the required switching speed and minimized sensitivity to variations affecting switching speed.

The driver circuit of this invention is useful in transmission of digital data, especially at high speeds, with reduced variation of rise and fall times in comparison with other driver circuits, and with minimum susceptibility to noise and external radiation interference.

Other embodiments of the invention will be apparent to those skilled in the art from a consideration of this specification or from practice of the invention disclosed herein. For example, the driver may be implemented wholly or partially in technologies other than CMOS, provided equivalent functions are performed. It is intended that the specification and examples be considered as exemplary only, with the true scope and spirit of the invention being defined by the following claims.

Accordingly, the scope of the invention should be determined not by the embodiments illustrated, but by the appended claims and their legal equivalents.

What is claimed is:

1. A driver circuit for transmission of data signals on a channel, said driver circuit comprising:
    first and second buffer units for receiving data signals to be transmitted over the channel, each of said first and second buffer units including a first power supply side and a second power supply side;
    a differential switch responsive to said data signals, said differential switch being driven by positive and negative drive-currents, said differential switch including:
        a) a first switch coupled to said first buffer unit, said first buffer unit supplying said data signals to said first switch; and
        b) a second switch coupled to said second buffer unit, said second buffer unit supplying said data signals to said second switch;
    a pair of complementary output terminals coupled to said differential switch for releasing said data signals into the channel;
    first and second drive-current limiting devices for limiting respective ones of said positive and negative drive-currents to a required value, said first drive-current limiting device being connected to said first switch via a first current-limited node, said second drive-current limiting device being connected to said second switch via a second current-limited node, one of said first and second power supply sides of said first buffer unit being coupled to said first current-limited node, one of said first and second power supply sides of said second buffer unit being coupled to said second current-limited node;
    a bias cell connected to said first and second drive-current limiting devices for biasing said first and second drive-current limiting devices to the required value; and
    a current-shunting switch operative to switch said positive and negative drive-currents such that said positive and negative drive-currents bypass said complementary output terminals.

2. A driver circuit as recited in claim 1, wherein said first switch includes a first pair of transistors and said second switch includes a second pair of transistors, said second pair of transistors being complementary to said first pair of transistors, said first and second pairs of transistors together forming two pairs of complementary transistors.

3. A driver circuit as recited in claim 1, wherein said bias cell includes an input for receiving a reference current, said bias cell including first and second current mirrors coupled to said input and being controlled by said reference current.

4. A driver circuit as recited in claim 2, wherein said first switch includes a first pair of gate nodes and said second switch includes a second pair of gate nodes, said second pair of gate nodes being complementary to said first pair of gate nodes, said first buffer unit including a first pair of buffers coupled to said first pair of gate nodes, said second buffer unit including a second pair of buffers coupled to said second pair of gate nodes.

5. A driver circuit as recited in claim 4, wherein said current-shunting switch includes a third pair of complementary transistors and a third pair of gate nodes, said driver circuit further comprising a third pair of buffers, each buffer of said third pair of buffers coupled to a respective one of said third pair of gate nodes.

6. A driver circuit as recited in claim 5, wherein a voltage at each of said current-limited nodes equals the sum of a voltage drop across the corresponding transistor of said differential switch and a signal amplitude at the corresponding output terminal.

7. A driver circuit as recited in claim 3, wherein
    said first current mirror is operative:
        a) to provide a first bias voltage to said first drive-current limiting device and
        b) to provide a matching current of the reference current to said second current mirror, and
    said second current mirror is operative:
        a) to provide a second bias voltage to said second drive-current limiting device.

8. A driver circuit as recited in claim 7, wherein said first current mirror comprises:
    a PMOS transistor operative to mirror said reference current, said PMOS transistor having a drain and a gate; and
    a first amplifier including an input and an output, the input of said first amplifier being coupled to the drain of said PMOS transistor and the output of said first amplifier being coupled to said first drive-current limiting device for generating the first bias voltage.

9. A driver circuit as recited in claim 8, wherein the output of said first amplifier is further coupled to the gate of said PMOS transistor for providing feedback.

10. A driver circuit as recited in claim 8, wherein said second current mirror comprises:
    an NMOS transistor coupled to said first current mirror to mirror said matching current, said NMOS transistor having a drain and a gate; and
    a second amplifier having an input and an output, the input of said second amplifier being coupled to the drain of said NMOS transistor and the output of said second amplifier being coupled to said second drive-current-limiting device for generating the second bias voltage.

11. A driver circuit as recited in claim 10, wherein the output of said second amplifier is further coupled to the gate of said NMOS transistor for providing feedback.

12. A driver circuit as recited in claim 3, further comprising a third current-limited node, said reference current provided through a resistor connected to said third current-limited node.

* * * * *